United States Patent
Varhue

(10) Patent No.: US 6,313,017 B1
(45) Date of Patent: Nov. 6, 2001

(54) PLASMA ENHANCED CVD PROCESS FOR RAPIDLY GROWING SEMICONDUCTOR FILMS

(75) Inventor: Walter J. Varhue, Georgia, VT (US)

(73) Assignee: University of Vermont and State Agricultural College, Burlington, VT (US)

(*) Notice: Subject to any disclaimer, the term of this patent is extended or adjusted under 35 U.S.C. 154(b) by 0 days.

(21) Appl. No.: 09/395,656

(22) Filed: Sep. 14, 1999

Related U.S. Application Data

(60) Provisional application No. 60/117,320, filed on Jan. 26, 1999.

(51) Int. Cl.[7] .............................. H01L 21/20; H01L 21/36
(52) U.S. Cl. ............................................ 438/503; 438/503
(58) Field of Search ................................... 438/481, 485, 438/503, 507; 427/255, 28, 582

(56) References Cited

U.S. PATENT DOCUMENTS

| | | | |
|---|---|---|---|
| 4,579,609 | 4/1986 | Reif et al. ............................. | 148/175 |
| 4,659,401 | 4/1987 | Reif et al. ............................. | 148/175 |
| 4,870,030 | * 9/1989 | Markunas et al. ..................... | 117/90 |
| 4,908,330 | 3/1990 | Arai et al. ............................. | 437/170 |
| 5,273,609 | 12/1993 | Moslehi ................................. | 156/345 |
| 5,294,285 | 3/1994 | Kanai et al. .......................... | 156/610 |
| 5,405,492 | 4/1995 | Moslehi ................................. | 156/643 |
| 5,571,749 | 11/1996 | Matsuda et al. ..................... | 437/113 |
| 6,064,081 | * 5/2000 | Robinson et al. .................... | 257/183 |

OTHER PUBLICATIONS

Conrad et al., "Si–Homoepitaxy By Electron Cyclotron Resonance CVD", 26th PVSC; Sep. 30–Oct. 3, 1997; Anaheim, CA.*

"Low Temperature Growth of Si By PECVD," by W.J Varhue et al., Solid State Technology, pp. 163–170, Jun. 1996.

"Epitaxial Film Thickness in the Low–Temperature Growth of Si(100) by Plasma Enhanced Chemical Vapor Deposition," by W.J. Varhue et al. App. Phys. Lett. 68(3), pp. 1–3 Jan. 1996.

"Low–Temperature Homoepitaxial Growth of Si by Electron Cyclotron Resonance Plasma Enhanced Chemical Vapor Deposition," by J.L. Rogers et al., App. Phys. Lett 67(7), pp. 971–973, Aug. 1995.

"PECVD for Crystalline Materials Modification of Surface Controlled Processes" J. Electrochem. Soc., vol. 136 No. 8, pp. 2399–2405, Aug. 1989.

* cited by examiner

*Primary Examiner*—Charles Bowers
*Assistant Examiner*—Asok Kumar Sarkar
(74) *Attorney, Agent, or Firm*—Downs Rachlin & Martin PLLC

(57) ABSTRACT

A process of epitaxially growing a Group IV semiconductor film on a surface (WS) of a substrate (W) made of a material comprising one of Si or Ge in a reaction chamber (14) under vacuum. The process includes the steps of heating the substrate to a temperature between 300° C. and 650° C., then introducing into the reaction chamber a first reactant gas containing one of Si and Ge corresponding to the material comprising the substrate while bombarding the surface with energetic ions having a flux ratio of about between 0.5 and 5 eV/adatom. The first reactant gas may be silane and the substrate made of Si, in which case the semiconductor film grown is Si. Alternatively, the first reactant gas may be germane and the substrate made of Ge, in which case the semiconductor film grown is Ge. Likewise, compounds of Si, Ge and C may be formed by introducing reactant gases comprising Si, Ge and C, for example silane, germane and methane, in the appropriate ratios.

17 Claims, 9 Drawing Sheets

PLASMA ENHANCED CVD PROCESS FOR RAPIDLY GROWING SEMICONDUCTOR FILMS

This application claims benefit of provisional application Ser. No. 60/117,320 filed Jan. 26, 1999.

FIELD OF THE INVENTION

The invention relates to the epitaxial growth of semiconductor films and in particular to the rapid growth of silicon-based and germanium-based films.

BACKGROUND OF THE INVENTION

Epitaxial Si, Ge, $Si_xGe_{1-x}$ and $Si_xGeYC_{1-x-y}$ thin films are used extensively in the production of Si-based microelectronic devices. Si is typically deposited on blanket Si substrates by the high temperature pyrolysis of one of the chlorosilane precursors, such as dichlorosilane. The use of silane $SiH_4$ as a precursor reduces the required substrate temperature. The use of a plasma assisted deposition process has the ability to reduce the substrate temperature for this growth process even further. The associated gaseous discharge assists in the creation of the precursors to film growth, such as SiH, $SiH_2$ and $SiH_3$, and also assists in the removal of impediments to film growth, e.g., hydrogen on the substrate surface. The movement of chemical species on the growth surface is enhanced by the energetic particle flux to the surface, which in general assists in the overall growth process. It is known that growth of epitaxial layers at lower substrate temperatures reduces unwanted autodoping, dopant diffusion and the creation of crystal defects. The ability to epitaxially deposit Si-based and Ge-based films at reduced substrate temperatures would improve the quality of semiconductor devices, would simplify the process used to fabricate such devices, and would make possible the fabrication of new device structures.

Currently there is considerable interest in the growth of $Si_xGe_{1-x}$ and $Si_xGe_yC_{1-x-y}$ alloys for producing heterojunction devices. Successful epitaxial growth of these heteroepitaxial alloys on Si substrates requires that low substrate temperatures (i.e., below 650° C.) be used to avoid relaxation of the pseudomorphic crystal structure. Unfortunately, the growth rate at such low substrate temperatures is presently quite small, on the order of 50 Å/minute.

Chemical vapor deposition (CVD) is a process in which chemical species in the vapor phase react on a heated substrate surface to produce a solid material film. Plasma assisted chemical vapor deposition (PECVD) is a specific variety of a CVD process in which energetic electrons in a gaseous discharge are used to assist in the production of reactive chemical species, principally in the gas. These species then participate in the deposition process. Further, energetic ion bombardment of the substrate surface may be included to aid in the growth process.

The ability to deposit epitaxial semiconductor films, doped or otherwise, is a critical technology required in fabricating integrated circuits. It has long been recognized that the ability to deposit semiconductor epitaxial films at reduced substrate temperatures will be required for the fabrication of subsequent generations of integrated circuit devices. In addition to the advantages stated above, low substrate temperature epitaxial growth of semiconductor films would permit the deposition process to be performed outside of thermal equilibrium. These advantages would result in a reduction in linewidth and junction depth of present device designs, and would permit the fabrication of new device structures currently limited by high processing temperatures.

The ability to grow epitaxial semiconductor films at reduced substrate temperatures using plasma assisted processes has been proven in numerous investigations. The exact role of the plasma in the deposition process has been attributed to a number of factors, as described in the article by W. J. Varhue, P. S. Andry, J. L. Rogers, E Adams, R. Kontra and M. Lavoie, entitled "Low temperature growth of Si by PECVD," *Solid State Technology*, 163 June (1996). These factors include: production of reactive species which are the precursor to film growth, the removal of adsorbed hydrogen from the growth surface which prevents the adsorption of growth species on the surface, and the increase in adatom surface mobility to lower the required deposition temperature.

Despite the recognized ability of plasma assisted processes to lower the required substrate temperature for epitaxial growth, such processes have failed to be accepted by semiconductor device manufacturers due to the low deposition rate (about 50 Å/min) and low resulting thin film quality.

To date, there have been attempts to grow Si and $Si_xGe_{1-x}$ compounds at low substrate temperatures at higher deposition rates. For example, U.S. Pat. No. 4,579,609 to Reif et al. ("the '609 patent") discloses a process and apparatus for epitaxially growing Si films by a PECVD process. The specification states, in column 7, lines 43–48, that "specular epitaxial films have been deposited at temperatures as low as 650 ° C. using low pressure CVD both with and without plasma enhancement. This is the lowest silicon epitaxial deposition temperature and the lowest pre-epitaxial cleaning temperature believed reported for thermally driven CVD." However, the inventors, J. H. Comfort and R. Reif, in a subsequent paper entitled "Chemical Vapor Deposition of Epitaxial Silicon from Silane at Low Temperatures", Journal of the Electrochemical Society 136 (8) 2430 (1989) state the same process would not work at temperatures below 700 ° C.

Further, the '609 patent does not emphasize the role of energetic ion bombardment of the substrate surface during the growth process, which, as discussed below, is a key aspect in achieving low temperature growth of Si-based films.

SUMMARY OF THE INVENTION

Briefly and in general terms, the invention concerns a process for depositing epitaxial Si, Ge, $Si_xGe_{1-x}$ and $Si_xGe_yC_{1-x-Y}$ films on Si or Ge wafer substrates ("wafers") at low substrate temperatures, i.e., below 650 ° C, and at high deposition rates, i.e., greater than 150 Å/min, and as high as 500 Å/min or greater. The deposition process is assisted by a gaseous discharge which acts to increase the deposition rate and to reduce the required substrate temperature. An exemplary gas discharge is an electron cyclotron resonance plasma, but this process in practice is not limited to such, and is extendable to other known plasma generating mechanisms, such as transformer coupled, inductively coupled, helicon, helical resonator, and remote or magnetically enhanced RF processes where energetic ion bombardment of the substrate surface is possible.

Accordingly, a first aspect of the invention is a process of epitaxially growing a Group IV semiconductor film, comprising the steps of first, providing a substrate having a surface made of a material comprising one of Si or Ge in a reaction chamber under vacuum. Then, heating the substrate to a temperature between 300 ° C. and 650 ° C., then introducing into the reaction chamber a first reactant gas containing at least one of Si and Ge, while simultaneously bombarding the surface with energetic ions having a flux ratio of about between 0.5 and 5 eV/adatom. The first reactant gas may be silane and the substrate made of Si, in which case the semiconductor film grown is Si. Alternatively, the first reactant gas may be germane and the substrate made of Ge, in which case the semiconductor film grown is Ge. Likewise, compounds of Si, Ge and C may be formed by introducing silane, germane and methane reactant gases in the appropriate ratios, as described in detail below.

A second aspect of the invention is the process as described above, wherein the energetic ions are formed from at least one member of the group of elements and compounds consisting of He, Ar, Ne, Kr, $SiH$, $SiH_2$, and $SiH_3$.

A third aspect of the invention is a process for making a pn junction diode in a reaction chamber under vacuum. The process comprises the steps of first, providing a Si substrate with a surface and heating the substrate to a temperature between 300° C. and 650 ° C., and then introducing a first reactant gas containing Si into the reaction chamber and simultaneously forming a first region of the pn junction by bombarding the surface with energetic ions having a flux ratio of about between 0.5 and 5 eV/adatom, while introducing one of an n-type or a p-type dopant. The next step is then forming a second region of the pn junction atop the first region immediately following the previous step. This is accomplished by bombarding the surface with energetic ions having a flux ratio of about between 0.5 and 5 eV/atom, while introducing to the surface the opposite one of the n-type and the p-type dopant introduced in the previous step. The final step is then forming an electrical contact between the first region and the second region.

DETAILED DESCRIPTION OF THE INVENTION

The present invention is a process to rapidly grow high quality epitaxial Si, Ge, $Si_xGe_{1-x}$ and $Si_xGe_yC_{1-x-y}$ films at low substrate temperatures, i.e., below 650° C., and at high deposition rates, i.e., greater than 150 Å/min.

The current process has been developed for use in an electron cyclotron resonance (ECR) PECVD reactor. However, the critical deposition conditions of adatom flux and energetic ion bombardment are also possible in other plasma reactor configurations, such as helicon, transformer coupled, helical resonator, magnetically enhanced and remoted PECVD, where the addition of substrate biasing can duplicate the conditions described herein below.

Figure 1:
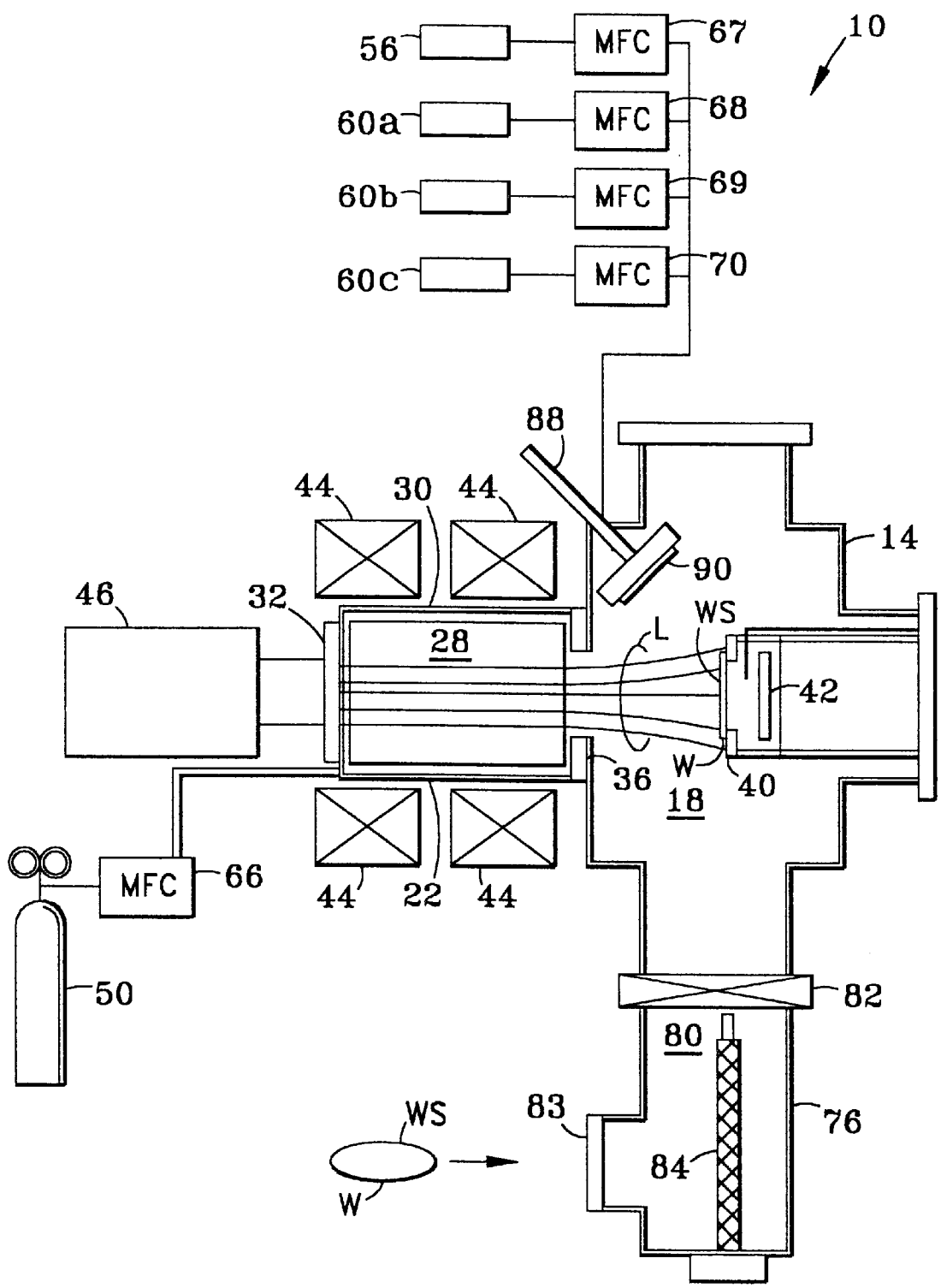
FIG. 1 is cross-sectional schematic diagram of the ECR-PECVD reactor apparatus used to practice the process of the present invention.

With reference to FIG. 1, reactor apparatus 10 comprises a primary reaction chamber 14 enclosing a primary interior region 18, and a secondary elongate chamber 22 enclosing a secondary interior region 28 open to region 18. A quartz liner (not shown) is preferably provided in chamber 22. The latter also includes an outer wall 30 and an end portion 32 made of quartz. A gas ring 36 is located between regions 18 and 28. Apparatus 10 further includes within region 18 a substrate holder 40 capable of holding a wafer W or other substrate having a surface WS, and a radiative heater 42 arranged adjacent the substrate holder so as to be able to heat the wafer. Radiative heater 42 may be, for example, a boron-nitride coated radiative heater. Wafer W is preferably made of Si or Ge for growing Si and Ge based alloy films. Growth of high concentration alloy films on the opposing substrate, e.g. Si on Ge or Ge on Si requires first depositing a suitable buffer layer (e.g., a layer of Si or Ge grown at a different temperature) on the wafer surface.

Apparatus 10 further includes DC magnets 44 surrounding outer wall 30 of chamber 22, and a microwave radiation source 46 outside of chamber 14 and adjacent end portion 32. When activated, magnets 44 produce magnetic field lines L, as shown. Also included in apparatus 10 is an argon (Ar) gas source 50 in fluid communication with interior regions 18 and 28, and a hydrogen ($H_2$) gas source 56 in fluid communication with interior region 18. Further included is a silane gas source 60a, germane gas source 60b, and methane gas source 60c (e.g., hydride gases), each in fluid communication with interior region 18. Mass flow controllers 66–70 are included between each of gas sources 50, 56 and 60a–60c, respectively, and the interior regions to which each respective gas source is in fluid communication. With continuing reference to FIG. 1, apparatus 10 further includes a load-lock chamber 76 connected to main chamber 14. Load-lock chamber 76 has an interior region 80 separated from interior region 18 by a gate valve 82. Chamber 76 includes a load lock door 83 for allowing placement of wafer W within interior region 80, and a load lock arm 84 for holding and loading the substrate onto wafer holder 40. Apparatus 10 also preferably includes a RF sputter gun 88 arranged in chamber 14. RF sputter gun 88 includes a sputtering target 90 which faces wafer surface WS of substrate W. Sputtering target 90 may be made of Sb or other suitable material for doping the film to be deposited on surface WS of wafer W.

Process for growing Si, Ge, $Si_xGe_{1-x}$ and $Si_xGe_yC_{1-x-y}$ films

Figure 2:
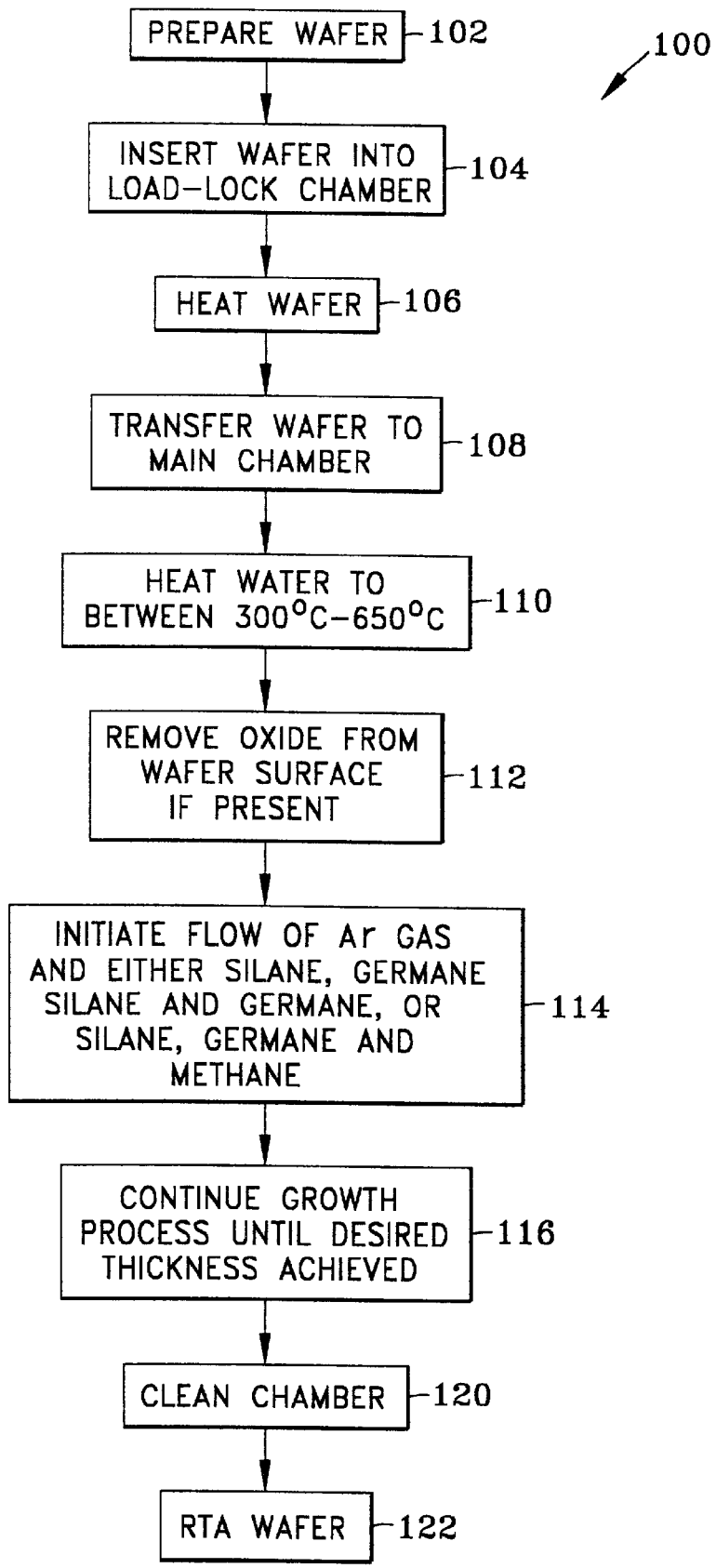
FIG. 2 is a flow diagram of the steps for epitaxially growing a Si film, a Ge film, a $Si_xGe_{1-x}$ film or a $Si_xGe_yC_{1-x-y}$ film according to the present invention.

With reference to apparatus 10 of FIG. 1, and also to flow diagram 100 and steps 102–116 of FIG. 2, the process of epitaxially growing Si, Ge, $Si_xGe_{1-x}$ and $Si_xGe_yC_{1-x-y}$ films according to the present invention is now described.

First, in step 102, wafer W is prepared. This preparation includes cleaning surface WS such that it is free of any oxide and is H-terminated, meaning that a layer of H atoms is site-absorbed to the atoms at wafer surface WS. This may be accomplished using one of a number of different techniques, such as submersing wafer W in a dilute (1:10) solution of HF. Preparation of wafer W may also include degreasing in trichloroethane, followed by a rinse in methanol and then DI water prior to etching in a dilute HF solution. It is preferable that, after wafer W is inserted into the HF solution, it not be exposed to an oxygen-containing ambient. If it is, it will require a subsequent in-situ cleaning step to remove the regrown oxide layer.

Next, in step 104, wafer W is inserted into region 80 of load lock chamber 76 through load lock door 83. With load lock door 83 and gate valve 82 closed, load lock chamber 76 is evacuated, preferably to a desired vacuum level pressure of about $10^{-5}$ Torr or less (i.e., even greater vacuum).

Then, at optional step 106, wafer W is heated (e.g., to about 400° C.) in the load lock chamber to remove excess $H_2O$ vapor that may have deposited on wafer surface WS.

Next, in step 108, wafer W is transferred from region 80 in loadlock chamber 76 to interior region 18 of primary reaction chamber 14 and is placed in substrate holder 40. During this step, it is preferable to flow inert gas into region 18 to limit the flow of other gases from the load-lock chamber into this region. At this point, chamber 14 is continuously being pumped down to the desired vacuum level.

Next, in step 110, wafer W is radiatively heated via heater 42 to a temperature of between about 300° C. and 650° C. During this step, it is preferable to flow Ar gas into regions 18 and 28 to aid in pump-down of water vapor outgassing from the inner walls of chambers 14 and 22.

With continuing reference to FIGS. 1 and 2, next, in step 112, if an oxide is present on the wafer surface WS, its removal is required. This is preferably accomplished by using an $Ar/H_2$ plasma clean, which involves activating microwave radiation source 46 and DC magnets 44 and then introducing Ar gas from Ar gas supply 40 into interior region 28 and $H_2$ gas from $H_2$ gas supply 56 into interior region 18. The length of this plasma clean should be kept short, on the order of 1 minute, to avoid roughening the wafer surface. The duration of the cleaning time is determined by the length of time that microwave power is delivered to reactor apparatus 10 with hydrogen flowing.

For 200 W of power from microwave radiation source 46 and a flow of 20 sccm of $H_2$ at 5 mTorr, the cleaning process is preferably carried out for about 1 minute. The $Ar/H_2$ purge prior to the plasma clean is preferably about 2 minutes, with 30 sccm of Ar delivered to region 28 and 20 sccm of $H_2$ delivered to region 18. The pressure in chamber 14 during the cleaning process is preferably between 1–10 mTorr. The result of this cleaning process is that wafer surface WS is $H_2$-terminated. Other known ex-situ or in-situ cleaning processes that accomplish this end result without the plasma cleaning step may also be used.

Next, in step 114, the actual process of growing a Si, Ge, $Si_xGe_{1-x}$ or $Si_xGe_yC_{1-x-y}$ film on wafer surface WS begins without delay, i.e., such that the glow discharge plasma is not extinguished. The gas composition in the reactor, however, is changed as quickly as possible. This is accomplished by turning off the $H_2$ flow from $H_2$ gas source 56, and initiating the flow of gas from one or a combination of gas sources 60a–60c, with Ar, to interior region 18 and continuing the flow of pure Ar from Ar gas source 50 to interior a region 28. For growing a Ge film, germane gas is flowed from gas source 60b. For growing a Si film, silane gas is flowed from gas source 60a. For growing a $Si_xGe_{1-x}$ film, silane and germane are flowed from gas sources 60a and 60b at a desired ratio (e.g., 5:1). For growing $Si_xGe_yC_{1-x-y}$, methane gas is also flowed from gas source 60c at a desired ratio (e.g., 5:1:20). A preferred rate of hydride gas flow from sources 60a–60c is between 2 and 30 sccm, and a total preferred rate of Ar gas flow into reactor apparatus 10 is between 65 and 80 sccm (e.g., by using a mixture of inert gas and reactant gas). Other preferred flow rates are between 25–35 sccm from gas source 50 to interior region 28, and between 35–45 sccm from one or more of gas sources 60a–60c to interior chamber region 18. This gas ratio balances the flow in reactor apparatus 10 to permit the transport of some hydride gas into interior region 28. The gas flow from gas sources 60a–60c may be accomplished in practice by using gas bottles with set mixtures of hydride and Ar compositions. With the changing total gas feed rates into interior regions 18 and 28 of reactor apparatus 10, may be necessary to mechanically readjust the flow rates to maintain a constant reactor pressure from the clean to deposition steps of the process.

The actual physical and chemical processes involved in the plasma enhanced deposition process of Ge, Si and their associated alloys are very complex and have been the subject of many studies over the past thirty years. Consider the case of growing an Si-based film on a Si wafer. A feed gas (for example, silane) is introduced into chamber 14. In chamber 14, a gaseous plasma is generated through one of a number of processes to produce energetic electrons, gaseous ions and metastable gaseous atoms. In one embodiment of the present invention, the working gas is Ar, though any inert gas, such as Ne, Kr or He may be used. Once silane or other reactive gas is mixed with these three energetic entities, a number of reaction possibilities can occur. These possibilities include excitation, ionization, and disassociated. In the case of silane, the silane molecule disassociates into fragments or radicals (i.e. $SiH_3$ and $SiH_2$) which are the precursor to film growth. The addition of germane or methane produces similar species or reactive radicals in the gas phase of the system. These radicals collide with the Si substrate surface and react further on the substrate surface to form a coherent epitaxial thin film. The composition of the film can be controlled by the relative composition of hydride gases supplied to the chamber. Other characteristics of the hydride gases, such as the relative ease with which reactive radicals are produced by collision with energetic electrons in the discharge also effect this ratio. For example when depositing a $Si_xGe_{1-x}$ alloy, a silane to germane ratio of (5:1) will produce a film with a Si to Ge ratio of (14:1).

The film growth rate using the process of the present invention depends mainly on the temperature of wafer W, the microwave power of microwave radiation source 42, and the feed gas flow rates. The deposition rate obtained in the process of the present invention depends principally on the microwave power level and the flow rate of hydride feed gases. The experimental results presented below show a dependence on these operating parameters. In general, the microwave power levels used should be equal to or greater than 200 W, and preferably between 200 and 350 W. Higher microwave power levels can be used, but the flow of reactive gas needs to be increased accordingly. Also, the deposition time was varied from 5 to 20 minutes and was stopped by terminating the supply of microwave power to reactor apparatus 10. The flow of reactant gases was then halted and the power to radiative heater 42 was turned off. The wafer was allowed to cool in reactor apparatus 10 for approximately 20 minutes, and then was removed to the load lock chamber 76. The pressure in reactor apparatus 10 was about 5 m Torr.

Figure 3:
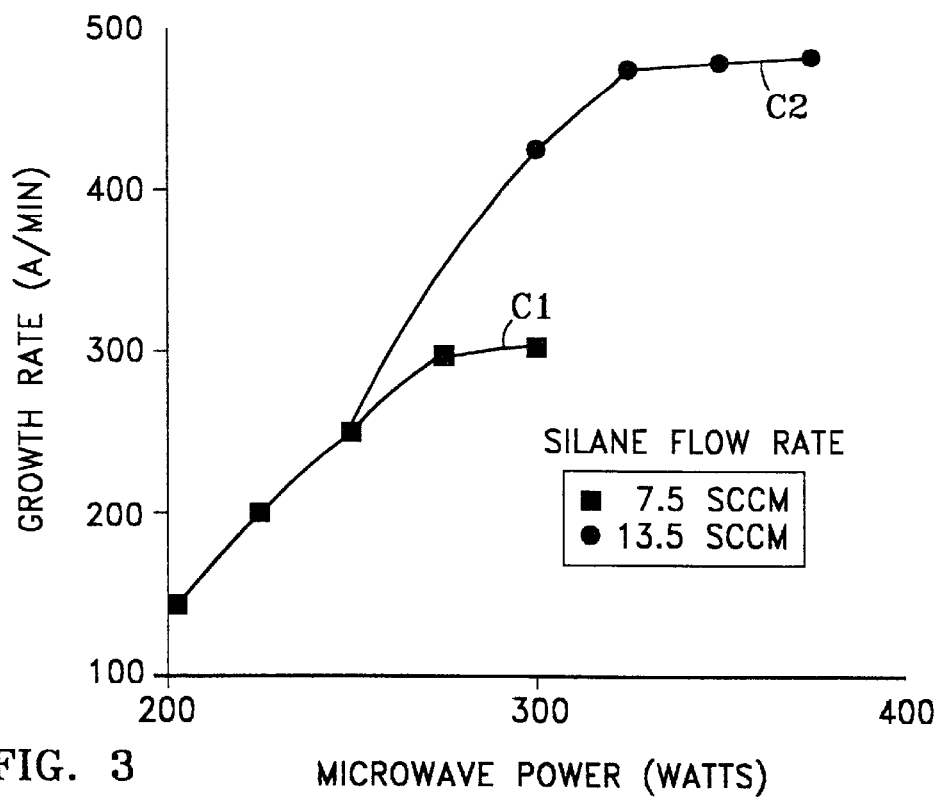
FIG. 3 is a plot of the growth rate dependence of epitaxial Si films deposited at 450° C. and two different levels of silane flow as a function of microwave power level.

With reference now to FIG. 3, for a fixed substrate temperature of 450° C., and a fixed silane gas flow rate of 7.5 sccm, the Si growth rate increases essentially linearly to about 300 Å/min at a microwave power of about 275 W, and then flattens out, as indicated by curve C1. At this point, the Si growth is reaction-rate limited. When the silane gas flow rate is increased to 13.5 sccm, the Si growth rate becomes linear with microwave power up to a growth rate of about 475Å/min at a microwave power of about 320 W, and then flattens out, as indicated by curve C2.

Figure 4:
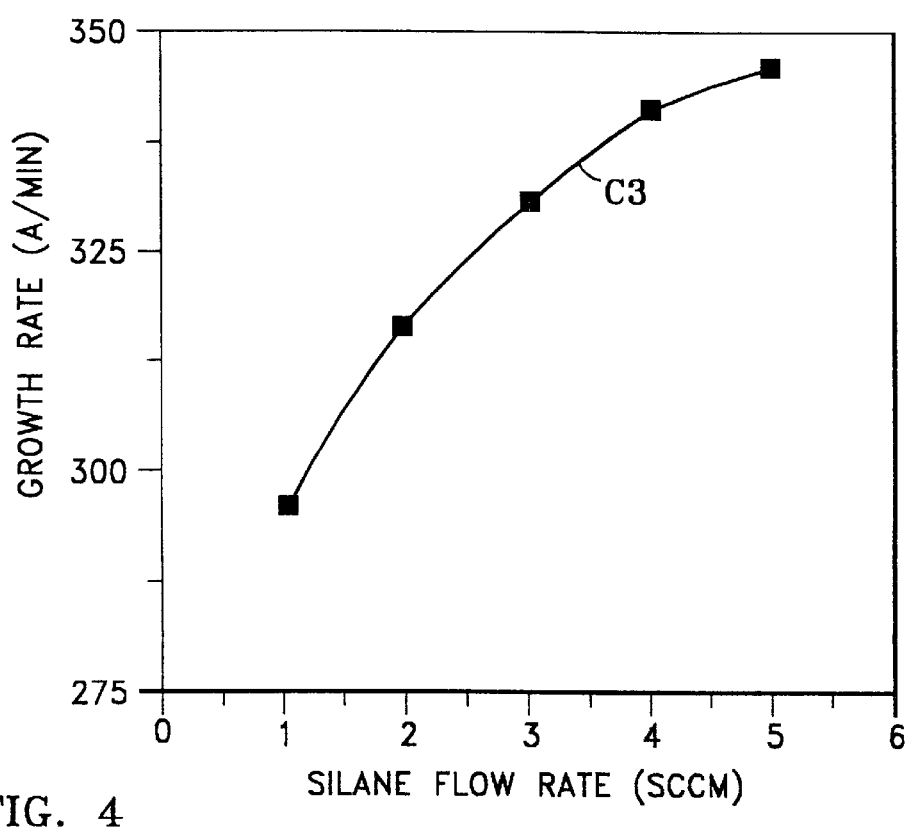
FIG. 4 is a plot of the growth rate dependence of epitaxial Si films deposited at 550° C. and 275 W of microwave power as a function of silane flow rate.
Figure 5:
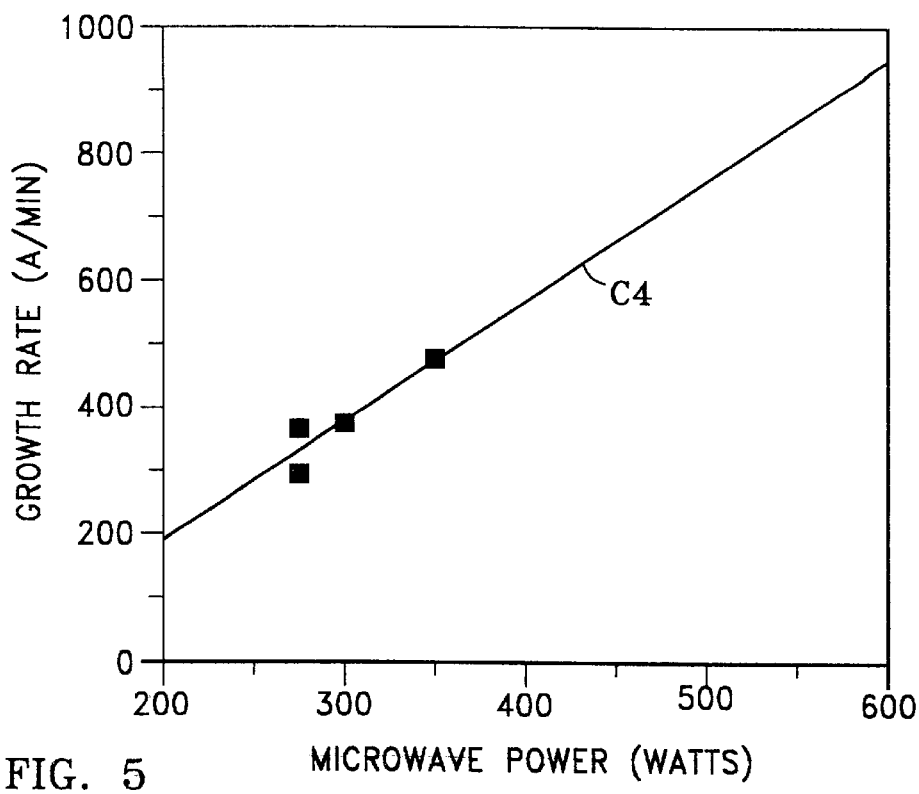
FIG. 5 is a plot showing the extrapolated growth rate as a function of microwave power level at saturated silane flow rates.
Figure 6:
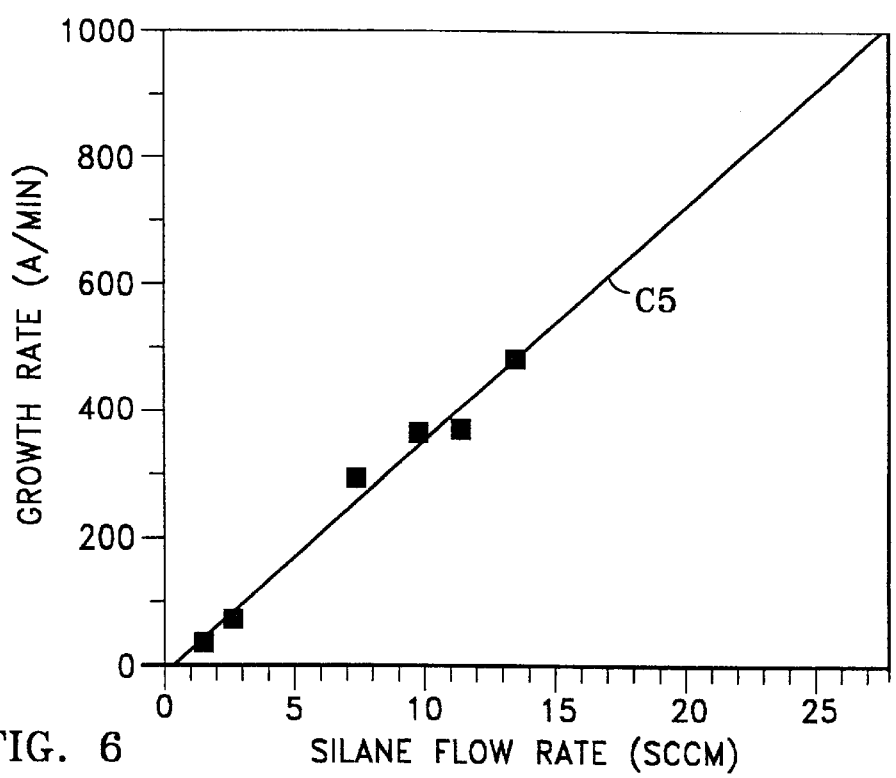
FIG. 6 is a plot showing the extrapolated growth rate as a function of silane flow rates at saturated microwave power levels.

With reference now to FIG. 4, for a fixed substrate temperature of 550° C. and 275 W of microwave power, the Si growth rate increases as a function of silane flow rate, as indicated by curve C3. Also, with reference to FIGS. 5 and 6, it can be seen that the Si growth rate as a function of microwave power (FIG. 5) and silane gas flow rate (FIG. 6) can reasonably be extrapolated to fairly high growth rates of 600Å/min and beyond, as indicated by curves C4 and C5, respectively.

Accordingly, with reference again to FIG. 2, in the next step 116, the film growth process is continued under the operating conditions of choice within the parameters as described above until a desired film thickness is achieved. The parameters for growing a Ge film are similar to those described above for Si.

Chamber 14 needs to be periodically cleaned of residual particulate residues. Accordingly, in step 120, chamber 14 is cleaned, preferably by operating the Ar ECR plasma with addition of a fluorine or hydrogen containing a gas such as $NF_3$ or $H_2$. The period of this cleaning cycle is on the order of minutes, depending on the frequency and length of use of apparatus 10.

Improvement in the thin film material quality maybe obtained by the addition of a post deposition thermal anneal process step. Accordingly, in step 122, wafer W is exposed to a rapid thermal annealing (RTA) step with a suggested temperature of between 1,000 and 1200° C.

Figure 7:
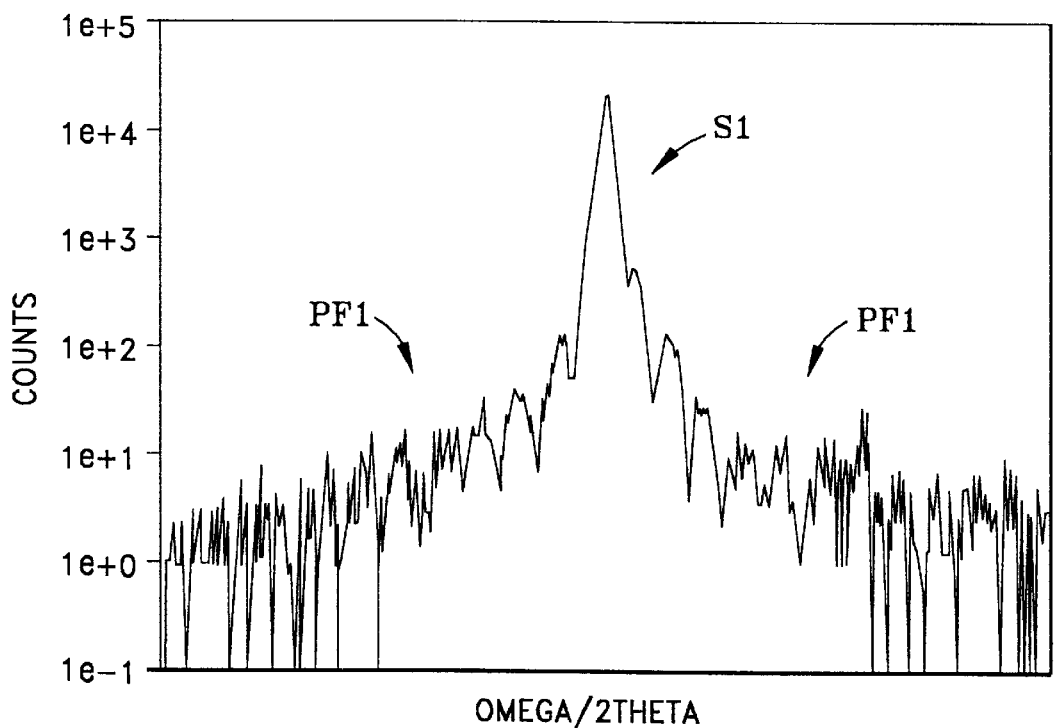
FIG. 7 is an X-ray rocking curve spectrum for an epitaxial Si sample prepared using the process of the present invention.
Figure 8:
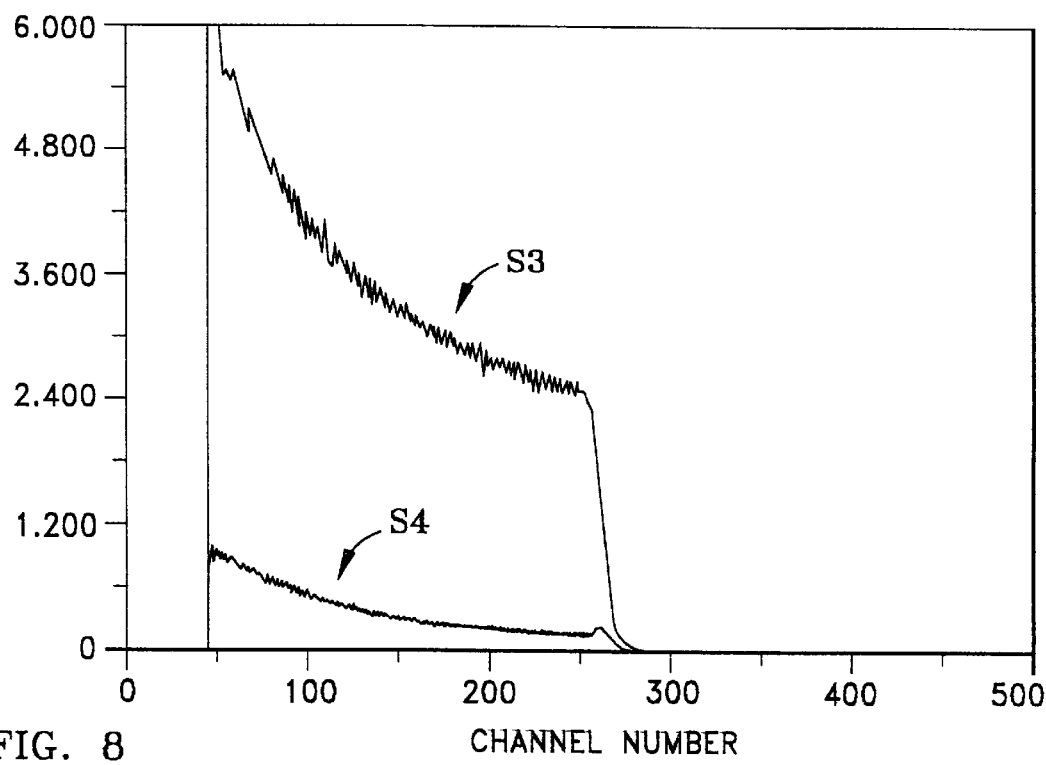
FIG. 8 is a Rutherford backscatter channeling spectrum for the epitaxial Si sample referred to in FIG. 7.

With reference to FIG. 7, there is shown an x-ray diffraction spectrum S1 of a silicon film grown using the above described process under the following conditions: microwave power (350 W), substrate temperature (450° C.), silane flow rate (13.5 sccm), Ar flow rate (30 sccm upstream and 42 sccm downstream), at a resulting deposition rate of 479 Å/min. This result, as well as all others presented herein were obtained without the benefit of any post deposition anneal steps. Pendellosung fringes PF1 indicate high epitaxial quality material. In addition, with reference to FIG. 8, there are shown two Rutherford backscatter (RBS) channeling spectra S3 and S4, the ratio between the two being known as the "chi min" value. A small chi min value is indicative of high epitaxial quality. In RBS spectra S3 and S4, the calculated "chi min value" is 6%, indicating a high epitaxial film quality.

Mechanism for process of growing Si, Ge, $Si_xGe_{1-x}$ and $Si_xGe_yC_{1-x-y}$ films The mechanism for the process of growing Si, Ge, $Si_xGe_{1-x}$ and $Si_xGe_yC_{1-x-y}$ films according to the present invention is believed to have two key components. For growing Si-based films, the first is the production of reactive species (SiH, $SiH_2$, and $SiH_3$) from silane by the plasma discharge. For growing Ge-based films, the reactive species GeH, $GeH_2$, and $GeH_3$ are formed from germane. These species are the precursors to film growth. The second is that the energetic ion flux at the growth surface increases the successful utilization of these available reactive chemical species in the growth of an epitaxial film. Accordingly, energetic ion bombardment of the growth surface is an important aspect for the film growth process of the present invention. The energetic ion flux in units of (eV) can be characterized as being on the same order of magnitude as the arrival rate of adatoms to the growth surface. The ion energy/adatom flux ratio (hereinafter, "Flux Ratio") required for epitaxial growth is influenced by the substrate temperature, growth rate, vacuum level and alloy composition of the deposited thin film material. This Flux Ratio is preferably between about 0.5 and 5 eV/adatom.

The production of reactive species in the gas phase is believed to be another important factor in achieving high Si, Ge, $Si_xGe_{1-x}$ and $Si_xGe_yC_{1-x-y}$ deposition rates using this technique. In a preferred arrangement, the flow rate of the silane/Ar mixture or the germane/Ar mixture into interior region 18 of main chamber 14 when growing a Si or Ge film exceeds the flow rate to interior region 28 of secondary chamber 22. Presumably, a portion of the silane or germane feed gas finds its way to interior region 28 of chamber 22, where it is effectively activated. This phenomenon is believed to contribute to the observed increase in the Si, Ge, $Si_xGe_{1-x}$ and $Si_xGe_yC_{1-x-y}$ deposition rate.

Experimental results

As discussed above, deposition rate obtained in the process of the present invention depends principally on the microwave power level and the flow rate of hydride feed gases. The A experimental results presented below show a dependence on these operating parameters. In general, the microwave power levels used should be equal to or greater than 200 W, and preferably between 200 and 350 W. Higher microwave power levels can be used, but the flow of reactive gas needs to be increased accordingly. Also, the deposition time was varied from 5 to 20 minutes and was stopped by terminating the supply of microwave power to reactor apparatus 10. The flow of reactant gases was then halted and the power to radiative heater 42 was turned off. The wafer was allowed to cool in reactor apparatus 10 for approximately 20 minutes, and then was removed to the load lock chamber 76. The pressure in reactor apparatus 10 was about 5 m Torr.

The ion flux incident on wafer surface WS during the film growing process of the present invention was measured with a Faraday cup. The ion flux was observed to increase with microwave power and decreasing reactor pressure. The energy of an Ar ion incident on the wafer surface WS was also measured with a gridded electrostatic ion energy analyzer. It was found that ion energy increases with increasing microwave power and decreasing reactor pressure. The average magnitude of the measured ion energy is on the order of the threshold energy known to cause atomic displacements in Si (i.e., 12–13 eV). Assuming a sticking coefficient of 1, the Flux Ratio can be calculated. This calculation is performed at the point where the growth rate is observed to saturate for increasing microwave power (see FIG. 3). Growth rate saturation for Si films, for example, also occurs with increasing silane flow rate, as indicated in FIG. 4. The saturation point from curves C1–C3 can be used to calculate the Flux Ratio. Similar curves can be used for deducing parameters for growing Si and Ge based alloy films. The results of these calculations for pure Si films are presented in Table I, below.

TABLE I

Calculated results for Si growth parameters

| Substrate Temperature (° C.) | Microwave Power (W) | Growth Rate (Å/min) | Ion Flux (uA/cm2) | Ion Energy (eV) | Flux Ratio (eV/adatom) |
|---|---|---|---|---|---|
| 450 | 270 | 300 | 31 | 12.4 | 0.96 |
| 450 | 325 | 480 | 48 | 12.6 | 0.94 |
| 550 | 275 | 340 | 31 | 12.4 | 0.85 |

For the two saturation points described in Table I, obtained by increasing microwave power at a substrate temperature of 450° C., the Flux Ratios are essentially identical. The Flux Ratio obtained by increasing silane flow rate at a substrate temperature of 550° C. is similar, but lower. This lower Flux Ratio is expected, as the increased substrate (wafer) temperature contributes thermal energy to the epitaxial growth process. The exact mechanism by which the higher substrate temperature increases the Flux Ratio is most likely a combination of phenomena, such as an increase in desorption of impurity atoms from the growth surface, as well as an increase in the adatom surface mobility. However, epitaxial growth at high deposition rates is made possible by the assistance of energetic ion bombardment. The conditions available at 450° C. result in a Flux Ratio equal approximately to 1.0 (eV/datom). Increasing the vacuum quality above $5 \times 10^{-7}$ Torr acts to decrease the required Flux Ratio, as the flux of impurity atoms to the surface will be reduced. The required Flux Ratio can be larger than 1.0 if vacuum quality decreases or the substrate temperature is reduced. Even lower substrate temperatures may be desired in certain applications. In these cases, the flux ratio needs to be higher by increasing the microwave power or decreasing the flow rate of one or more reactive gases.

The results obtained from the plasma assisted epitaxial growth of Si-based alloys, such as $Si_xGe_{1-x}$, and elemental films such as Ge, can also be explained using the model described above for the case of Si film growth. As in the case above, for $Si_xGe_{1-x}$, energetic Ar ions are directed at the growth surface, which is supplied with a flux of Si and Ge adatoms. The incident ions are supplying energy to the growth surface much as a stone thrown into a pond creates a wave disturbance on the water's surface. This energy, in turn, affects the adatom mobility on the surface, allowing the atoms to move across the surface until an energetically favorable site for epitaxial growth is found. In the case of Ge (atomic mass 72.6 gr/mole), greater kinetic energy is required to obtain the same surface mobility or velocity as that of Si (atomic weight 28 gr/mole). The following relationship equating surface velocities for Si and Ge adatoms indicates the dependence for adatom energies:

$$V_{Si-VGe} = (2E_{si}/M_{si})^{1/2} = (2E_{Ge}/M_{Ge})^{1/2},$$

wherein $E_{si}$ and $E_{Ge}$ are the kinetic energies of Si and Ge, respectively, and $M_{si}$ and $M_{Ge}$ are the masses of Si and Ge atoms, respectively. Based on the above relationship, the ratio of energy required by Ge is 2.59 time that for Si. To relate this to the Flux Ratios obtained above for Si (0.95 eV/adatom), a value of 2.46 eV/adatom for the case of Ge is anticipated. Calculation of this measured Flux Ratio, similar to that calculated above for the case of Si, can be performed with the saturated growth rate data for $Si_xGe_{1-x}$, obtained from FIG. 9.

Tabulation of these results is presented in Table II below.

TABLE II

Experimentally determined results for $Si_xGe_{1-x}$

| Substrate Temperature (° C.) | Microwave Power (W) | Growth Rate (Å/min) | Ion Flux (uA/cm2) | Ion Energy (eV) | Flux Ratio (eV/adatom) |
|---|---|---|---|---|---|
| 450 | 375 | 350 | 63 | 12.8 | 1.78 |

The measured Flux Ratio value is lower than what has been predicted using the simple model above. As a first correction to this model, the adatom mass used in this calculation should be a weighted average of Si/Ge atomic masses representing the alloy composition. Assuming a 7% Ge composition, the average $Si_xGe_{1-x}$ adatom has a weighted mass of 31 gr/mole. Using this value in the above relationship yields a Flux Ratio of 1.11 eV/adatom. At this point, the experimentally determined value is bounded above and below by predicted values using simple theoretical considerations. Further corrections to this Flux Ratio could be made by considering the differences of chemical affinity between the adatoms and the substrate and the affinity of impurities with the substrate. However, the current predictions are adequate to make the desired point.

Figure 9:
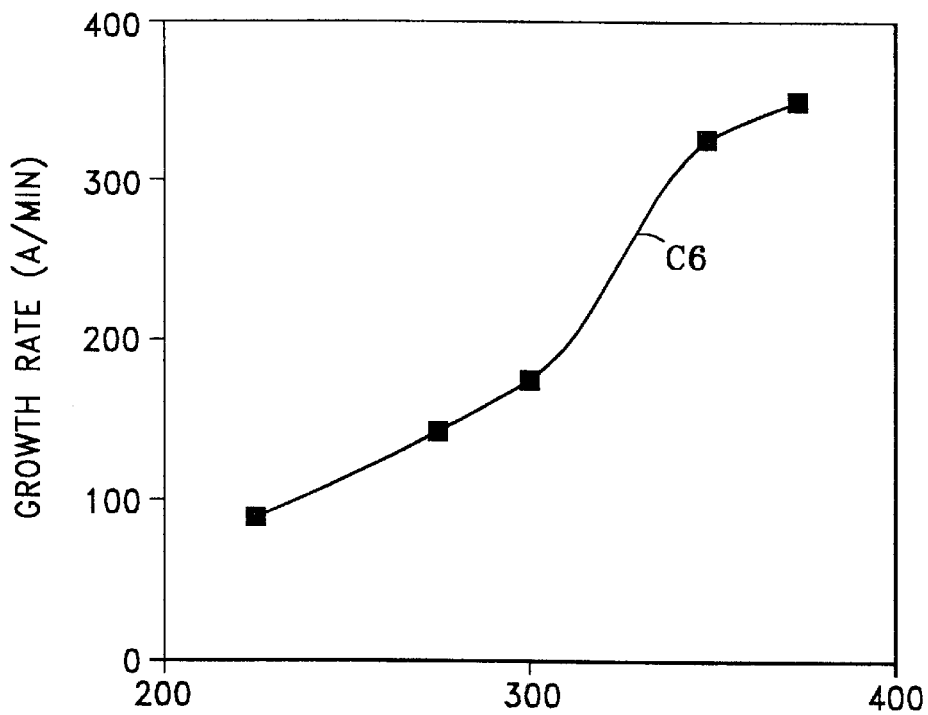
FIG. 9 is a plot of the growth rate dependence of epitaxial $Si_xGe_{1-x}$ films deposited at 450 ° C. and a silane/germane flow rate of (7.5 sccm/1.5 sccm) as a function of microwave power level.
Figure 10:
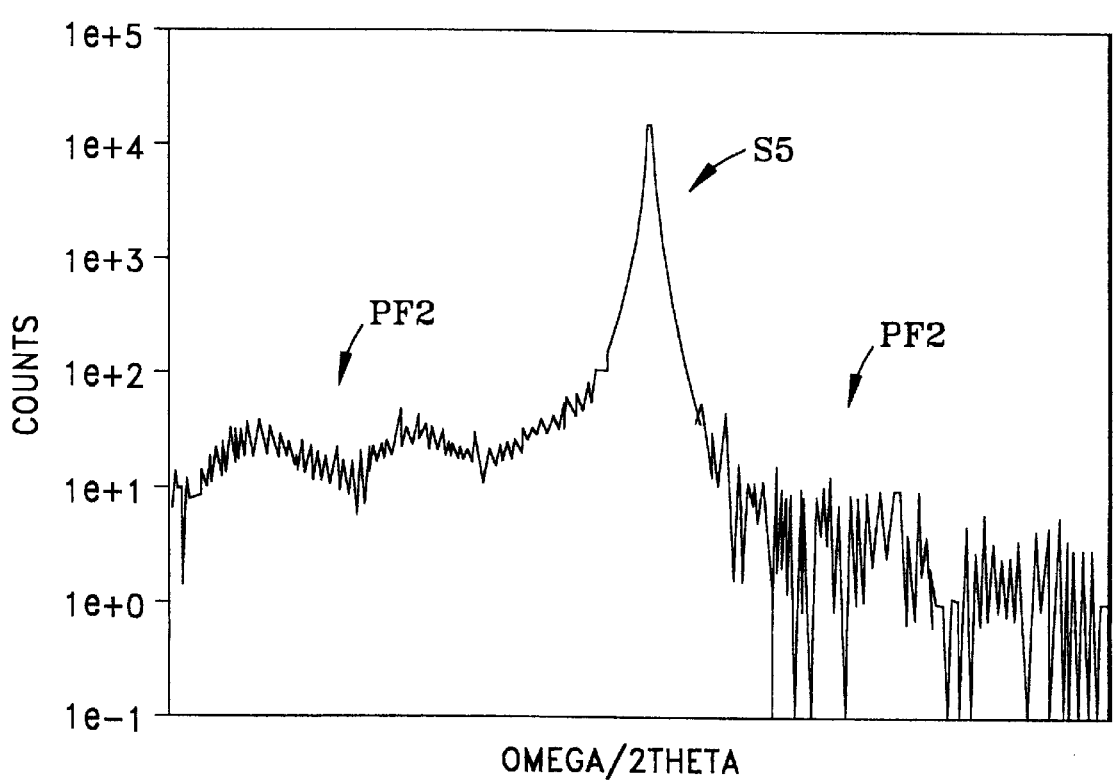
FIG. 10 is an X-ray rocking curve spectrum for an epitaxial $Si_xGe_{1-x}$ sample prepared using the process of the present invention.
Figure 11:
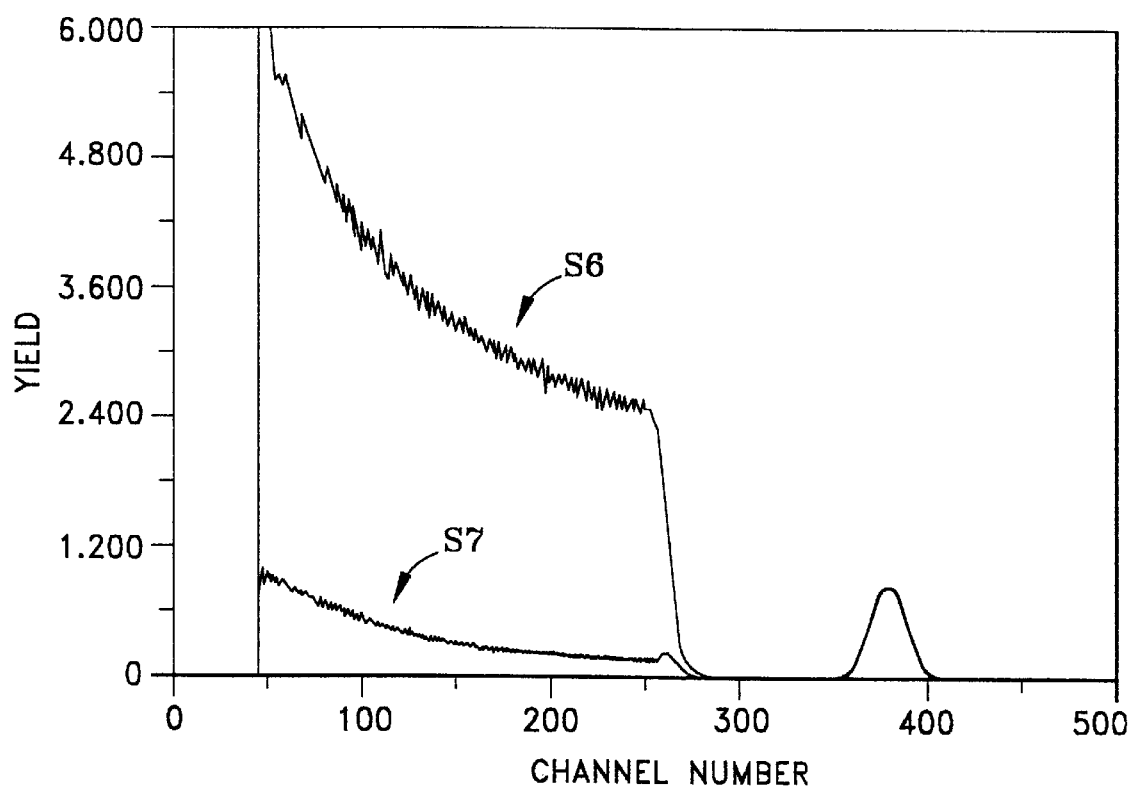
FIG. 11 is a plot of a Rutherford backscatter channeling spectrum for the sample referred to in FIG. 10.

The above growth rate dependence applies to the deposition of heteroepitaxial $Si_xGe_{1-x}$ and $Si_xGe_yC_{1-x-y}$ films on Si substrates. An example of this growth rate dependence as a function of microwave power level for $Si_xGe_{1-x}$ films is shown in FIG. 9. In this case, the silane flow rate is 7.5 sccm and the Ge flow rate is 1.5 sccm. It is seen from curve C6 that the deposition rate begins to saturate at a microwave power level of 375 W. The deposition rate therefore can be increased further by raising the reactant feed rate (silane and germane) and then further by increasing the microwave power level. Results are similar to those observed with the growth of Si. The crystalline quality of the $Si_xGe_{1-x}$ films has been determined by both high resolution x-ray diffraction and RBS channeling. A representative x-ray diffraction spectrum S5 is shown in FIG. 10 for a film prepared under the following conditions: microwave power (275 W), substrate temperature (450° C.), silane flow rate (7.5 sccm), germane flow rate (1.5 sccm), Ar flow rate (30 sccm upstream, and 40 sccm downstream) and a resulting deposition rate of 332 Å/min. Pendellosung fringes PF2 are apparent in the diffraction spectrum, indicative of excellent quality. RBS spectra S6 and S7 for this same film is shown in FIG. 11. The "chi min" value for this $Si_xGe_{1-x}$ film is 6%, a further indication of excellent epitaxial quality. Another piece of information that can be received from this spectrum is the high level of channeling experience from the Ge component of the film. This is an indication that the Ge atoms, which amount to 6.9% of the composition, have assumed lattice site locations.

Process for making a pn junction

Figure 12:
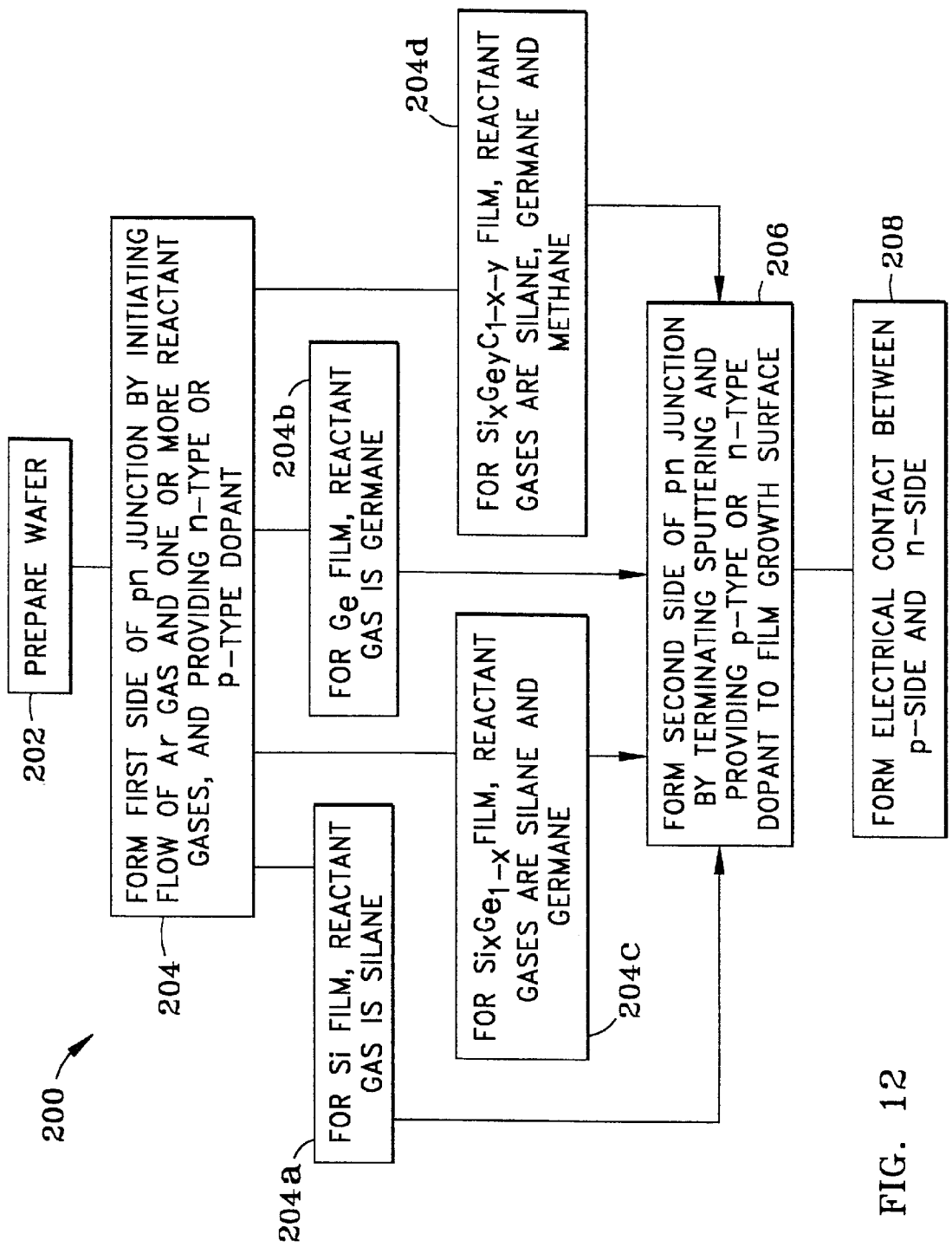
FIG. 12 is a flow diagram of the process steps for making a pn junction according to the present invention.
Figure 13:
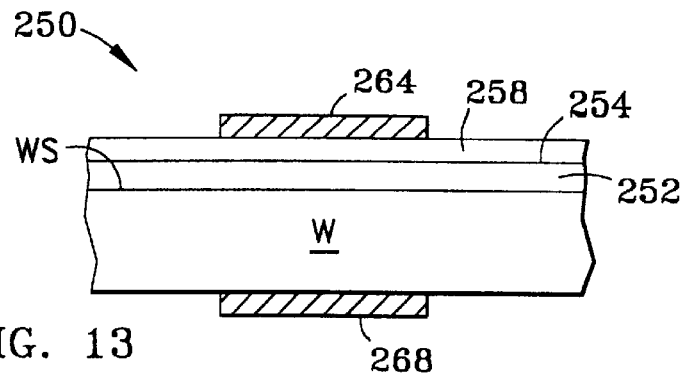
FIG. 13 is a cross-sectional diagram of a first embodiment of a pn junction diode fabricated using the process steps of the present invention as set forth in FIG. 12.

With reference to apparatus 10 of FIG. 1, and also to flow diagram 200 and steps 202–208 of FIG. 12, and to FIG. 13, the process of making a pn junction 250 according to the present invention is now described.

First, in step 202, a wafer W is prepared for the start of epitaxial growth in the reactor chamber. Preparation step 202 includes steps 102 through 114, described above in connection with flow diagram 100 of FIG. 2.

Next, in step 204, the actual process of growing an electrically doped Si, Ge, $Si_xGe_{1-x}$ and $Si_xGe_yC_{1-x-y}$ film on wafer surface WS begins without delay. This is accomplished by turning off the $H_2$ flow from $H_2$ gas source 56 and initiating the flow of gas from gas sources 60a–60c and the flow of Ar from Ar gas source 50 to interior region 18 of chamber 14. For growing a Si film, silane gas is flowed from gas source 60a (step 204a). For growing a Ge film, germane gas is flowed from gas source 60b (step 204b). For growing a $Si_xGe_{1-x}$ film, silane and germane are flowed from gas sources 60a and 60b at a desired ratio (step 204c). For growing $Si_xGe_yC_{1-x-y}$, methane gas is also flowed from gas source 60c at a desired ratio (step 204d). The preferred rate of gas flow from sources 60a–60c is between 2 and 20 sccm, and the preferred rate of Ar gas flow is between 70 and 80 sccm.

For fabricating a pn junction 250 with n-type material as a first region 252, a n-type dopant is added while the film is first being grown. With this combination, it is also assumed that the starting wafer material is also n-type. This can be accomplished, for example, by co-sputtering during growth using an Sb, RF coupled sputtering gun as sputtering gun 88. A preferred RF sputter gun 88 is 1.5 in. in diameter and is operated at 2 to 12 W of power. The resulting doping concentration depends on film growth rate and RF power supplied to the sputter gun. A typical growth rate is 350 Å/min with an anticipated doping concentration of $1\times10^{19}$ $cm^{-3}$. This forms the first region 252 of pn junction 250, which has a growth surface 254. Other options for adding n-type dopant include the addition of a gaseous dopant such as $PH_3$.

Next, in step 206, the second region 258 of pn junction 250 is formed. This is accomplished by ceasing the operation of the n-type sputter gun, and simultaneously, initiating the delivery of a p-type dopant to growth surface 254. This can also be accomplished, for example, by co-sputtering from a p-type dopant source, such as boron. Again, the resulting doping concentration depends on the film growth rate and RF power supplied to the sputter gun. This operation is ended when the desired film thickness has been deposited on growth surface 254. The sample is then removed from the reactor. Doping could also be accomplished by adding a P-type gaseous dopant such as diborane during growth of this layer.

Figure 14:
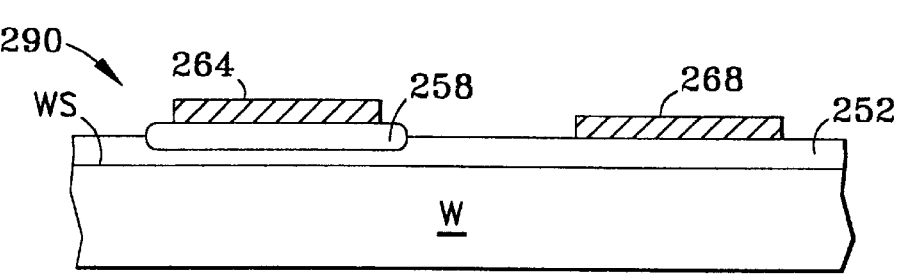
FIG. 14 is a cross-sectional diagram of a first embodiment of a pn junction diode fabricated using the process steps of the present invention, wherein the metal contacts are co-planar.

Next, in step 208, metal contacts 264 and 268 are formed so as to electrically connect to the n-region (here, first region 252) and the p-region (here, second region 258) of pn junction 250. With reference to FIG. 14 and pn junction 290, metal contacts 264 and 268 can be made coplanar, which requires diffusing a p-type material into the n-type first region 252 to create a p-type second region 258, and then forming metal contact 264 atop this second side. For example, second "region" 258 is formed in first region 252 by diffusing boron or by forming an alloyed indium contact. Alternatively, the top and back surfaces of wafer W can be metalized to form ohmic contacts between regions 252 and 258.

In the above-described process, it will be clear to one skilled in the art that first region 252 can be formed as the n-type region and second region 258 can be formed as the p-type region.

Figure 15:
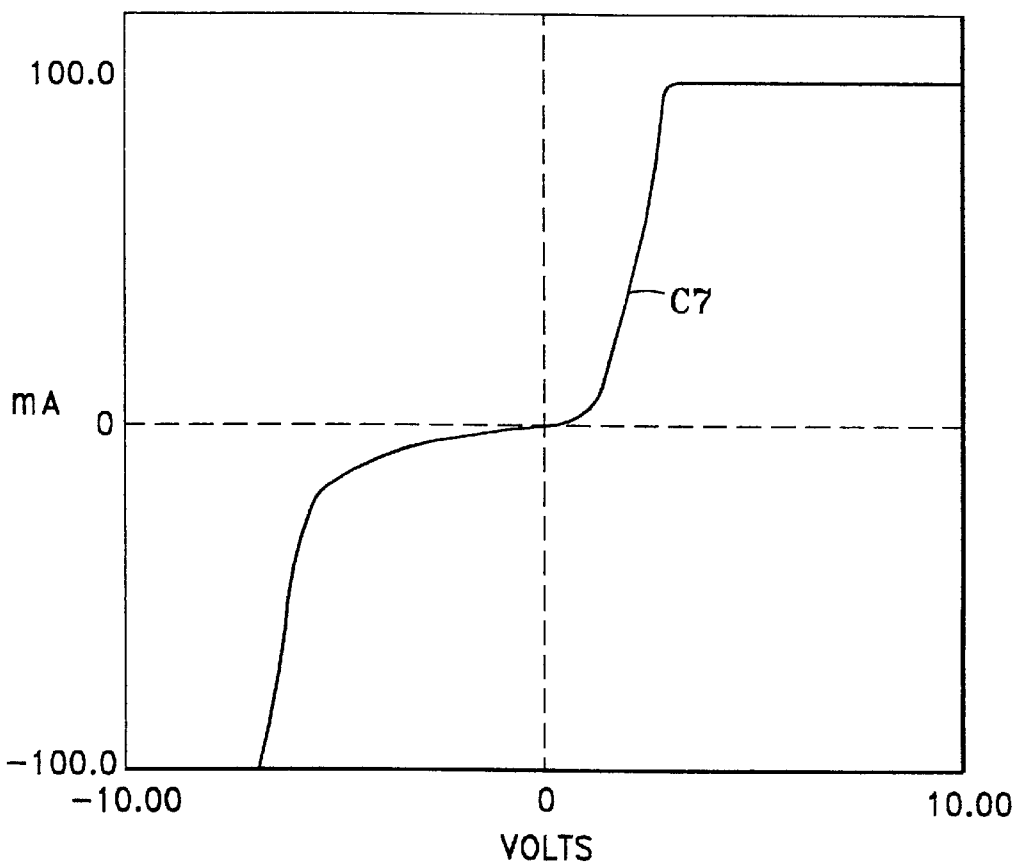
FIG. 15 is a plot of the characteristic I-V curve for the pn junction diode of FIG. 13.

An important measure of a semiconductor materials quality is its ability to produce properly functioning electronic devices. The above-described process was used to fabricate a pn junction diode by sputtering Sb from an RF driven sputtering target 90, located inside reactor chamber 14 during growth. Target 90 was operated at a power level of 10 W. Results from previous investigations using this doping source indicate an anticipated doping concentration of $1\times10^{19}$ $cm^{-3}$ for a Si growth rate of 350 Å/min. A diode was fabricated by depositing In and Al metal contacts, followed by a 200° C. anneal step. The I-V curve C7 resulting from the electrical characterization of this diode is shown in FIG. 15. Curve C7 is clearly that of a properly functioning pn junction diode.

The process of growing Si, Ge, $Si_xGe_{1-x}$ and $Si_xGe_yC_{1-x-y}$ films according to the present invention will favorably impact the fabrication of integrated circuits which require the deposition of Si, Ge, $Si_xGe_{1-x}$ and/or $Si_xGe_yC_{1-x-y}$ epitaxial thin film materials. The principal advantage of the present invention is that the deposition rates are high (i.e., much greater than 50 Å/min) and the required substrate temperatures are low (i.e., less that about 650° C.). The present invention will furthermore permit the fabrication of device structures such as heterojunction bipolar transistors that are limited by thermal equilibrium and diffusion.

An additional application of the present invention will include the fabrication of devices, such as wavelength specific photodiodes and $Si_xGe_{1-x}$ based CMOS devices, which involve the growth of crystalline $Si_xGe_{1-x}$ and $Si_xGe_yC_{1-x-y}$ alloy films on Si substrates. The equilibrium lattice constant of $Si_xGe_{1-x}$ varies from 5.43 Å, for pure Si, to 5.66 Å for pure Ge. If the $Si_xGe_{1-x}$ film is deposited at a high substrate temperature (>600° C.) or to a thickness beyond its pseudomorphic thickness (>300 Å), the film will relax with the creation of crystalline dislocations. A process to avoid this thermal relaxation is to deposit the material at a low substrate temperature, i.e., below 600° C. The lower the substrate temperature, the lower the forces driving this system to equilibrium or relaxation. Examples of device structures that will benefit from this technological advance are bandgap specific $Si_xGe_{1-x}$ and $Si_xGe_yC_{1-x-y}$ detectors, heterojunction bipolar devices, heterojunction CMOS and abrupt interface $Si_xGe_{1-x}$ and $Si_xGe_yC_{1-x-y}$ superlattices for a variety of quantum well devices.

While the present invention has been described in terms of preferred embodiments and working examples, it should be understood that it is not so limited. On the contrary, it is intended to cover all alternatives, modifications and equivalents as may be included within the spirit and scope of the invention as defined in the appended claims.

What is claimed is:

1. A process of epitaxially growing a Group IV semiconductor film comprising the steps of:
   a) providing a substrate having a surface made of a material comprising one of Si and Ge in a reaction chamber under vacuum,
   b) heating the substrate to a temperature between 300° C. and 650° C.;
   c) introducing into the reaction chamber a first reactant gas containing at least one of Si and Ge; and
   d) simultaneously with step c), bombarding the surface with energetic ions having a flux ratio of about between 0.5 and 5 eV/adatom.

2. A process according to claim 1, wherein the semiconductor film has a growth rate of greater than 150 Å/min.

3. A process according to claim 1, wherein the semiconductor film has a growth rate of greater than 600 Å/min.

4. A process according to claim 1, wherein said energetic ions are formed from at least one member of the group of elements and compounds consisting of He, Ar, Ne, Kr, SiH, $SiH_2$, and $SiH_3$.

5. A process according to claim 1, wherein said first reactant gas is silane, said substrate is made of Si and the semiconductor film is Si.

6. A process according to claim 1, wherein said first reactant gas is germane, said substrate is made of Ge and the semiconductor film is Ge.

7. A process according to claim 1, further including the step, immediately after said step b), of removing oxide from the surface of the substrate if oxide is present thereon.

8. A process according to claim 1, wherein said step c) involves adding said first reactant gas containing one of Si and Ge and a second reactant gas containing the opposite one of Si and Ge of said first reactant gas, into the reaction chamber, and wherein the semiconductor film is $Si_xGe_{1-x}$.

9. A process according to claim 8, wherein said first reactant gas is one of silane and germane, and said second reactant gas is the opposite one of said silane and germane of said first reactant gas.

10. A process according to claim 8, wherein said step c) further includes the step of adding a third reactant gas containing carbon into the reaction chamber, and wherein said semiconductor film is $Si_xGe_yC_{1-y-x}$.

11. A process according to claim 10, wherein said third reactant gas is methane.

12. A process according to claim 1, wherein said energetic ions are created by a combination of microwave radiation and a magnetic field introduced within the reaction chamber.

13. A process according to claim 12, wherein said microwave radiation has a power of at least 150 W and said first reactant gas has a flow rate of at least 2 sccm.

14. A process according to claim 1, wherein said first reactant gas has a flow rate of between 2 and 30 sccm.

15. A process according to claim 1, wherein said energetic ions are created from an inert gas flowed into the reaction chamber.

16. A process according to claim 15, wherein said inert gas is flowed into the reaction chamber at a flow rate of between 25 and 35 sccm, and said first reactant gas is flowed into the reaction chamber at a flow rate of between 35 and 45 sccm.

17. A process according to claim 1, further including the step, after said step c), of rapidly thermally annealing the surface.

* * * * *